United States Patent [19]
Seip

[11] Patent Number: 4,851,608
[45] Date of Patent: Jul. 25, 1989

[54] ELECTROMAGNETIC SHIELDING MEDIA AND METHODS FOR MANUFACTURING THE SAME

[75] Inventor: Donald P. Seip, Bridgewater, N.J.

[73] Assignee: Technical Wire Products, Inc., Cranford, N.J.

[21] Appl. No.: 47,893

[22] Filed: May 8, 1987

[51] Int. Cl.$^4$ ............................................. H05K 9/00
[52] U.S. Cl. ............................. 174/35 MS; 428/116; 428/118; 428/593
[58] Field of Search ................... 174/35 MS; 428/116, 428/118, 593

[56] References Cited

U.S. PATENT DOCUMENTS 3,546,359 12/1970 Ciccarelli et al. ............. 174/35 MS
3,580,981 5/1971 Lamp et al. .................... 174/35 MS
3,821,463 6/1974 Bakker .......................... 174/35 MS Primary Examiner—Arthur T. Grimley
Assistant Examiner—David A. Tone
Attorney, Agent, or Firm—John N. Bain; Raymond J. Lillie

[57] ABSTRACT

An electromagnetic shielding media and a method for fabricating the same including a honeycomb layer composed of relatively conductive strips continuous in only one direction, adjacent "flat" of the continuous strips being mechanically joined by a substantially non-conductive material, the edges of the respective conductive strip where mechanically joined by the substantially non-conductive being flame spray coated with a relatively electrically conductive material to provide an electrically conductive path between adjacent strips.

22 Claims, 1 Drawing Sheet

ELECTROMAGNETIC SHIELDING MEDIA AND METHODS FOR MANUFACTURING THE SAME

BACKGROUND OF INVENTION

This invention relates to electromagnetic interference (EMI) and radio frequency interference (RFI) shielding media and specifically to omnidirectional EMI/RFI shielding media and methods for fabricating the same.

The terms EMI and RFI refer to the impairment of performance of an electronic system or subsystem by unwanted electromagnetic disturbances. Recently, EMI and RFI have been referred to generically as EMI. Throughout this application, reference will only be made to EMI, but such reference includes EMI and RFI.

Electromagnetic compatibility is achieved by reducing the EMI below the level that disrupts proper operation of the electronic system. This compatability is generally achieved by means of various devices, such as line filters and equipment shields. Any barrier placed between any emitter of EMI and an electronic system which is suceptible to disruption that diminishes the strength of the interference can be regarded as an EMI shield. The shielding effectiveness is the measure of the ability of that media to control radiated electromagnetic energy. The standard unit for measurement of shielding effectiveness is the decibel (dB).

The losses in field strength from a shielding media are a function of a number of parameters, including the barrier material (permeability, conductivity and thickness), frequency and distance from the EMI source to the shield. In most shielding applications, shielding effectiveness below 20 dB is considered only minimal shielding, 20 dB to 80 dB covers the normally acceptable shielding range and 80 dB to 120 dB is above the average shielding. Above 120 dB shielding effectiveness is difficult to achieve often requiring the use of special designs, materials and finishes and difficult to confirm by measurement.

A number of various shielding media is known in the prior art. One of the most commonly employed shielding media for covering openings in an enclosure, which either houses the emitter or potential receptor of EMI, is a metallic honeycomb structure, commonly made from steel, brass or aluminum. The honeycomb structure is commonly fabricated by applying adhesive or glue at spaced apart intervals to a plurality of straight metal strips. When the adhesive or glue has set, the metal strips, which are readily bendable are pulled apart in a direction perpendicular to the faces of adhesion. By spacing the adhered or glued sections away from each other, a distance equal to the length along the strip of the glued or adhered section, a generally hexagonal honeycomb is generated.

A principal disadvantage of the above-referenced honeycomb structure lies in the fact that immediately adjacent strips are electrically insulted from each other by virtue of the fact that the adhesive or glue is essentially non-conductive. Accordingly, the honeycomb structure exhibits unidirectional electrical conductivity in generally parallel paths along each metal strip. While these electrically conductive pathways provide excellent conductivity in the direction of the long dimension of the strips, they provide virtually no electrical conductivity in pathways normal to the plain of each conductive strip.

Most EMI is well-known to be omnidirectional. By virtue of the fact that EMI shielding is achieved by channelling the interfering electromagnetic radiation along the pathways of conductivity to a ground station, the shielding effect of the abovereference honeycomb structure is unidirectional and, therefore, functions poorly with omnidirectional EMI at those frequencies which are most troublesome.

Omnidirectional EMI panels or media are known in the prior art. One such panel is shown and described in U.S. Pat. No. 3,821,463 and comprises essentially a pair of honeycomb panels as above-referenced in fact-to-face engagement with each other with the continuously conductive metal strips of one panel oriented at right angles to the continuously conductive strips of the other panel. Other omnidirectional panels are known in which the honeycomb structure above-referenced and a frame surrounding the structure are nickel plated in a non-electrical plating operation. Such a honeycomb structure may also be plated with other metals such as cadmium, tin, copper and steel. The plating process to generate such a shielding media is both time-consuming and expensive particularly in the case of nickel plating. Obviously, in the case of the structure shown in U.S. Pat. No. 3,821,463, the expense of two honeycomb panels must be borne and in addition thereto, there is an increase in both weight and thickness of the panel and an increase of the pressure drop in air flowing through the shield over a similar shield having only one thickness of honeycomb.

It is desirable to employ the honeycomb structure described above, made from aluminum because of corrosion resistance, light weight and ease and low cost of manufacture of the honeycomb structure itself. Accordingly, it is among the objects and advantages of the present invention to provide an EMI shielding media which is both omni-directional and inexpensive to manufacture, particularly of aluminum which is corrosion resistant. Additionally, it is among the objects and advantages of the present invention to provide an EMI shielding media which generates the lowest possible pressure drop or impediment to the passage of cooling air.

In accordance with the present invention, a lightweight omnidirectional EMI shielding media is fabricated by preparing an open latticwork structure of electrically conductive members, preferably a honeycomb, in the form abovereferenced, by applying adhesive or glue to adjacent, elongated, relatively electrically conductive members or strips at spaced-apart intervals and pulling the member apart at right angles to the long axis of the member or strips to generate a latticework having transverse openings with the edges of the strips defining generally planar faces. Thereafter, at least one face of the media generated thereby is flame sprayed with a relatively electrically conductive powder to generate electrically conductive bridges between adjacent strips at the site of mechanical joinder. The electrical bridges thereby provide conductive pathways normal to the long dimension of the electrically conductive strips.

SUMMARY OF INVENTION

An omnidirectional electomagnetic shielding media and methods of fabricating the same in which the media consists of an open lattice-work structure of electrically conductive members extending generally in one direction with adjacent members being secured together at spaced-apart intervals with an electrically non-conductive barrier therebetween and an electrically conductive bridge of a deposit of thermally coalesced, electrically conductive particles sprayed thereon at the sites of mechanical joinder of the adjacent electrically conductive members to define electrically conductive pathways at an angle, preferably generally normal to the electrically conductive pathways defined by the electrically conductive members.

PREFERRED EMBODIMENT OF MEMBERS

A preferred embodiment of the present invention is described below in reference to the appended drawings in which.

Figure 1:
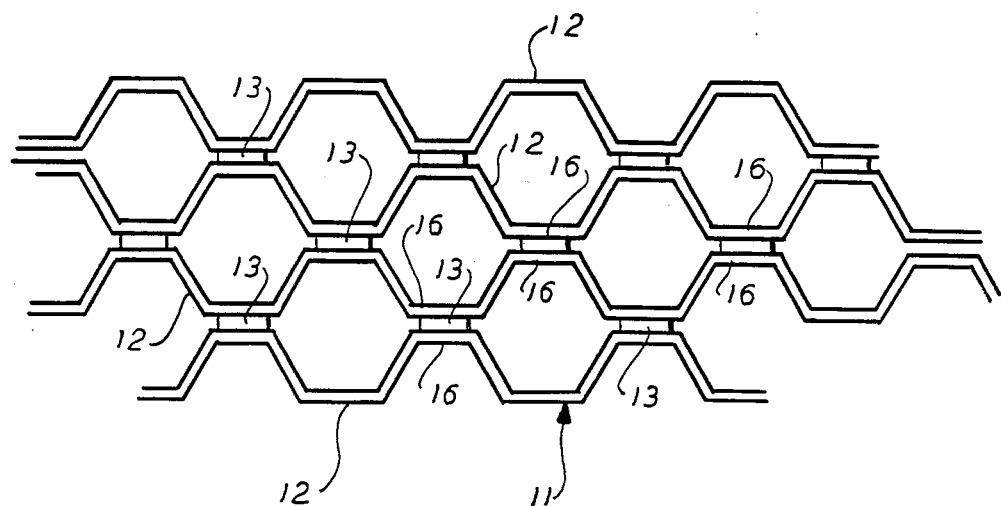
FIG. 1 is a front elevational view of a preferred embodiment of a honeycomb panel fabricated from strips of an electrically conductive material such as aluminum.
Figure 2:
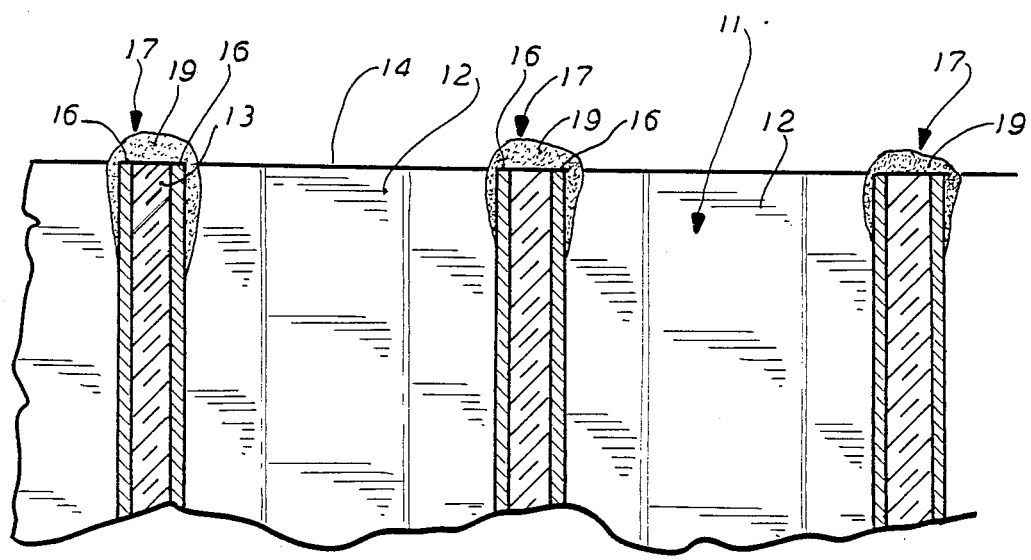
FIG. 2 is an end elevational cross-sectional view of a portion of the panel media shown in FIG. 1 looking in the direction of the arrow showing an electrical bridge of thermally coalesced, electrically conductive particles flame-sprayed thereon.

Referring now to the drawings in detail, the basic shielding media is a honeycomb comprised of an open lattice-work of electrically relatively conductive strips 12, 12 adhesively secured together as is generally shown in FIGS. 1 and 2. The fabrication of such honeycomb structure 11 is well-known in the art and does not need to be described in greater detail. The honeycomb structure 11 shown in FIGS. 1 and 2 is preferrably formed from an electrically conductive material, such as steel, copper, brass or aluminum. Aluminum is preferred for many purposes because of its light weight, maleability, electrical conductivity and corrosion resistance.

The strips 12 are secured together by an adhesive or glue layer 13 which is substantially non-conductive. Accordingly, the honeycomb structure #11 shown in FIG. 1 defines a plurality of electrical pathways extending in the direction of the long dimension of the strips 12 with substantially no electrical pathways normal to such direction. Such a honeycomb structure #11 exhibits unidirectional or poor omnidirectional EMI shielding characteristics.

In order to provide omnidirectional EMI shielding characteristics, electrically conductive pathways generally along strip 12 and at an angle, preferrably normal, to the electrical pathways defined by the electrically conductive strips 12 must be provided.

Such electrically relatively conductive pathways necessary to generate omnidirectional EMI shielding characteristics are generated by flame-spraying an electrically conductive powder on the face edges 16, 16 of immediately adjacent panels at the site of the adhesive or glue 13 which constitutes an electrically nonconductive barrier. The deposit of thermally coalesced, flame-sprayed, electrically conductive particles 19, creates an electrically conductive bridge 17,17 between adjacent electrically conductive strips 12 at their site of mechanical joinder. These electrically conductive bridges 17,17 provide electrically conductive pathways at an angle to the electrically conductive pathways of the strips 12, 12 in order to create omnidirectional EMI shielding characteristics.

Flame spraying of metallic powder is well-known. In a preferred embodiment of the invention, aluminum powder is employed and applied to aluminum strips approximately 0.0015 inches thick and one-half an inch wide. The flame spray gun employs two electrodes, one of which is an aluminum wire and generates thermally coalescable aluminum particles in the size range of approximately five to ten microns. Such flame spray guns are available from Tafa, Inc., of Bow, New Hampshire and Metco, Inc., of Westbury, Long Island.

It has been found that a deposit of thermally coalesced aluminum powder of two to three mils bridging the gap defined by the adhesive or glue layer 13 is sufficient to provide the required electrical pathways.

While flame-spraying of particles 19 of electrically conductive material has been described, any technique of depositing thermally coalesced electrically conductive particles 19 to provide electrically conductive bridges 17, 17 between adjacent strips 12, 12 is suitable and within the scope of the invention claimed herein except where specifically excluded by the claim. In addition to aluminum, other metals suitable for generating the thermally coalesced particular deposit are brass, copper, cadmium, tin and steel.

While it has been found that the deposit of thermally coalesced electrically conductive particles 19 is quite satisfactory, it has also been found that coating or dipping the edges of the strips 12, 12 at the site of mechanical joinder with an electrically conductive paint does not provide suitable electrical pathways. Moreover, the flame-spraying procedure is less costly and time consuming than other processes such as plating, dipping or painting.

Table I below illustrates the improvement in omnidirectional EMI shielding which can be achieved by the shielding media and processes for manufacturing the same described and claimed herein. The data was obtained by employing generally the procedures set forth in test procedure MIL-STD-461.

TABLE I

| | Total Shielding Effectiveness, Horizontal/Vertical$^{db}$ | | | | |
|---|---|---|---|---|---|
| TEST FREQUENCY | Panel Size 10¾" × 21¾" | | Panel Size 6" × 4" | | Panel Size 19¼" × 5¼" |
| | BEFORE | AFTER | BEFORE | AFTER | *PARACELL |
| 10 MHz | 27/65 | 97/97 | 60/105 | 100/101 | — |
| 100 MHz | 31/57 | 106/107 | 53/124 | 132/132 | — |
| 1 GHz | 38/80 | 102/103 | 82/110 | 124/110 | 109/98 |

The asterisk in Table I indicates that PARACELL is a trademark.

The asterisk in Table I indicates that PARACELL is a trademark.

The tests which generated the data shown in Table I were made on aluminum honeycomb panels of varying sizes. The aluminum strips of the different-sized panels were approximately 0.0015 inches in thickness and one-half an inch in width or depth. The hexagonal openings were approximately one-eighth of an inch across the diagonal. The electrically conductive bridges of thermally coalesced particles were on the order of two to three mils thick. Data was selected from the 10 MH$_Z$ to 1 GH$_Z$ range because EMI is significantly more disruptive at these frequencies.

In Table I the decibel values shown are those measured in planes normal to each other and represent the diminution in electromagnetic field strength due to the shielding media as determined by the difference between the incident field strength and the outlet field strength measured in decibels. The columns marked "Before" represent values obtained by testing an aluminum honeycomb prior to the deposit of the flame-sprayed aluminum particles to create electrically conductive bridges and the columns marked "After" represent the values obtained after such flame-spraying. The column marked "Paracell" represents test values from a honeycomb panel having the structure in accordance with U.S. Pat. No. 3,821,463 with the long axis of the electrically conductive strips making up one panel extending at right angles to those making up the other panel.

The values shown in Table I show a significant improvement in the omnidirectional EMI shielding characteristics after flame spraying which compare favorably with values generated by the panel of U.S. Pat. No. 3,821,463.

It has also been found that when the honeycomb media is mounted in an electrically conductive frame before flame spraying and the joint between the media and the frame is also flame-sprayed, the usual EMI leakage at the joint is also reduced thereby further enhancing the EMI shielding of framed panels of flames-prayed honeycombed media.

I claim:

1. An electromagnetic shielding media comprising:
   (a) a plurality of tortuous, elongated relatively electrically conductive members, extending generally in the same direction, and defining a plurality of first electrically conductive pathways in the direction of the members; adjacent members being discontinuously joined together at spaced-apart intervals along their length with a relatively electrically non-conductive barrier between the said members where joined, the adjacent members being spaced-apart where not mechanically joined to define passages extending transversely through the shielding media, and
   (b) a deposit of thermally coalesced, electrically conductive particles on the members where mechanically joined to define a relatively electrically conductive bridge between adjacent members and a plurality of second electrically conductive pathways extending in a direction across the first said pathways.

2. An electromagnetic shielding media in accordance with claim 1 in which:
   (a) the said relatively electrically conductive members are each a flat strip lying in a tortuous plane, the edges of the strips defining opposed faces on the media.

3. An electromagnetic shielding media in accordance with claim 2 in which
   (a) the said relatively electrically conductive strips are in their entirety formed of an electrically relatively conductive material.

4. An electromagnetic shielding media in accordance with claim 2 in which:
   (a) the deposit of thermally coalesced, electrically conductive particles extends across substantially all of the edges of the said strips where mechanically joined on at least one face of the media.

5. An elctromagnetic shielding media in accordance with any one of claims 2, 3, or 4 in which:
   (a) the said particles are aluminum.

6. An electromagnetic shielding media in accordance with any one of claims 2, 3, or 4 in which:
   (a) both the said strips and particles are formed of aluminum.

7. An electromagnetic shielding media in accordance with any one of claims 2, 3, or r in which:
   (a) both the strips and particles are formed from the same material.

8. An electromagnetic shielding media in accordance with any one of claim 2 in which:
   (a) the deposit of thermally coalesced electrically conductive particles extends across substantially all of the edges of the said strips where mechanically joined on both faces of the media.

9. An electromagnetic shielding media in accordance with claim 2 in which the deposit of thermally coalesced electrically conductive particles extends across substantially all of the edges of the said strips where mechanically joined on at least one face of the media, and further comprising:
   (a) an electrically conductive frame member surrounding the media, the media being electrically connected to the frame member along its entire course, and
   (b) a deposit of thermally coalesced, electrically conductive particles on the media and frame where said particles are engaged to define an electrically conductive bridge between the frame member and the media.

10. An electromagnetic shielding media and frame in accordance with claim 9 in which
    (a) the strips are aluminum 11. An electromagnetic shielding media and frame in accordance with claim 9 in which
    (a) the said particles are aluminum.

12. An electromagnetic shielding media and frame in accordance with claim 9 in which
    (a) the strips and particles are aluminum.

13. An electromagnetic shielding media and frame in accordance with claim 9 and
    (a) a deposit of thermally coalesced, electrically conductive particles on both faces of the media where engaged to the frame member.

14. An electromagnetic shielding media and frame in accordance with claim 9 in which
    (a) the said strips, particles and frame member are aluminum.

15. An electromagnetic shielding media and frame in accordance with claim 9 in which
    (a) the said strips, particles and frame member are the same material.

16. An electromagnetic shielding media in accordance with claim 1 in which:
    (a) the members are formed of aluminum.

17. An electromagnetic shielding media in accordance with claim 1 in which:
    (b) both the members and particles are formed of aluminum.

18. An electromagnetic shielding media in accordance with claim 1 in which:
    (a) both the said members and particles are formed of the same material.

19. A process for manufacturing an electromagnetic shielding media comprising (a) providing a plurality of tortuous, elongated relatively electrically conductive members extending generally in the same direction and defining a plurality of first electrically conductive pathways, adjacent members being discontinuously joined together at spaced-apart intervals along their length with a relatively electrically, non-conductive barrier where the members are joined, the members being spaced-apart where not mechanically joined to define passages extending transversely through the media; and (b) depositing thermally coalesced, electrically conductive particles on the members where joined to define a relatively electrically conductive bridge between adjacent members where joined.

20. The process in accordance with claim 19 in which:

(a) the thermally coalesced particles are deposited by flame spraying.

21. The process in accordance with any one of claims 19 or 20 in which:

(a) the thermally coalesced particles are aluminum.

22. The process in accordance with claim 21 in which:

(a) the members are strips of aluminum.

* * * * *